July 14, 1959 J. I. PANKOVE 2,895,058

SEMICONDUCTOR DEVICES AND SYSTEMS

Filed Sept. 23, 1954

INVENTOR.
JACQUES I. PANKOVE
BY
J. L. Whittaker
ATTORNEY 2,895,058
Patented July 14, 1959

2,895,058

SEMICONDUCTOR DEVICES AND SYSTEMS

Jacques I. Pankove, Princeton, N.J., assignor to Radio Corporation of America, a corporation of Delaware Application September 23, 1954, Serial No. 457,976

7 Claims. (Cl. 307—88.5)

This invention relates broadly to semiconductor devices and systems and more particularly to a novel transistor having a hook-type collector electrode and known as a hook transistor.

It is known to make semiconductor devices having a hook-type collector electrode. A hook-type collector electrode comprises a pair of closely spaced substantially parallel P–N rectifying junctions. Thus a hook transistor comprises a semiconductor body including P–N–P–N or N–P–N–P zones of semiconductor material. The theory and advantages of devices having such hook-type electrodes are discussed in an article by W. Shockley et al. entitled "P–N Junction Transistors" in the Physical Review for July 1, 1951, volume 83, at page 156. A transistor having a hook collector electrode and a method of making it is described in U. S. Patent No. 2,623,105 issued December 23, 1952, to W. Shockley et al. and entitled "Semi-Conductor Translating Device Having Controlled Gain."

An important feature of a hook-type collector electrode is the space charge effect produced between the pair of P–N rectifying junctions in the collector. This space charge makes possible a large current gain in a device employing a hook collector electrode. To a large extent, the advantages of a hook electrode are dependent upon the closeness of the spacing between the two rectifying junctions.

In a hook transistor, for example of P–N–P–N configuration, the first P-type region may comprise the emitter and the third and fourth P and N regions comprise the collector of the device while the second N-type region comprises the base of the device. In the normal operation of such a device, the emitter is biased in the forward direction with respect to the base region and as such has a positive bias applied thereto. On the other hand, the P-type region of the collector is biased in the reverse direction with respect to the base and as such a negative bias is applied thereto. Thus, in such a mode of operation, ordinarily, separate bias batteries are required for biasing the emitter and collector.

With such a bias arrangement, in the operation of this type of hook transistor, just as in the operation of a triode transistor, the output signal is in phase with the input signal at the emitter.

There are some circuit arrangements wherein it would be desirable to effect phase inversion between the input and output circuits of a translating device. Similarly, for reasons of economy, it would be desirable to be able to reduce the number of components in the power supply for translating devices.

Accordingly, an important object of this invention is to provide a semiconductor device and system of new and improved form.

A further object of this invention is to provide an improved semiconductor device and system of operation of the same whereby phase inversion between output and input signals may be achieved.

Another object of the invention is to provide a semiconductor device of new and improved form which may be operated with a simplified power supply and which may be operated in a complementary symmetry type of circuit.

In general, the principles and objects of the present invention are achieved by providing a semiconductor device including a body or base region of one type of conductivity, e. g. N-type, having another zone of N-type conductivity but more highly N-type than said base region. The device also includes two regions of opposite conductivity type (P-type) material wtih one of said P-type regions in contact with the body or base region and the other in contact with said other N-type zone.

In operation of the device, the P-type region in rectifying contact with the base region is operated as the emitter electrode of the device and the other P-type region in rectifying contact with the higher conductivity N-type zone is operated in conjunction with said latter zone as a hook-type collector electrode. For such operation, positive bias voltages are applied to each of the P-type regions whereby the same power source may be readily employed to provide such voltages. An input signal source is connected to the emitter electrode and an output circuit is coupled to the collector electrode. Due to the relationship of the various regions and zones of the device and due to the biases applied thereto, the output signal taken from the collector electrode is 180° out of phase with the input signal applied to the emitter electrode.

It is, of course, obvious that the foregoing conductivity types and their biases may be reversed if desired.

The invention is described in greater detail by reference to the drawing wherein:

Fig. 4 is an elevational view of a device embodying the principles of the invention and a schematic representation of a circuit in which it may be operated with a conventional triode transistor.

Figure 1:
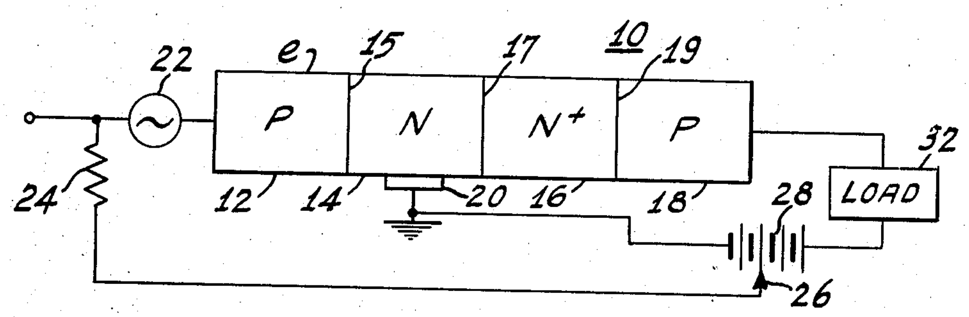
Fig. 1 is a schematic representation of a device and circuit embodying the principles of the invention.
Figure 1:
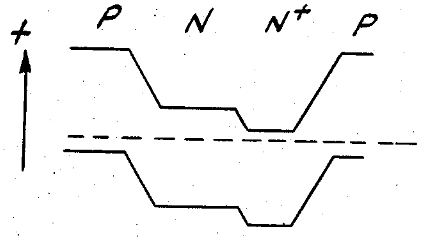

Referring to Figure 1, a device 10 according to the invention comprises a body of semiconductor material, for example germanium or silicon or the like including in order a region 12 of P-type conductivity, a region 14 of N-type conductivity separated from the region 12 by a rectifying barrier 15, a region 16 of N-type conductivity but of higher conductivity material represented as an $N^+$ zone and separated from the region 14 by a barrier 17, and another P-type region 18 separated from the zone 16 by a rectifying barrier 19.

If desired, the foregoing conductivity-types may be reversed as is well known in the art.

The device of the invention may be prepared, according to one method, by first evaporating onto a surface of an N-type semiconductor crystal a quantity of donor impurity material, e.g. antimony, and then heating the crystal to cause the impurity material to diffuse into the body of the crystal and to form a crystal having the regions 14 and 16.

Next, a P–N junction is formed in each of the regions of N-type germanium 14 and 16. One suitable P–N junction forming method employs an alloying or fusion technique such as that described by Law et al. in an article entitled "A Developmental Germanium P–N–P Junction Transistor" in the Proceedings of the IRE of November 1952.

Alternatively, in the device 10, the two regions 14 and 16 may be prepared by a conventional crystal growing operation from a melt of germanium. It is to be understood that the various regions or zones of the semiconductor crystal of the device 10 may be formed in any other suitable manner.

A base electrode 20 is connected in ohmic (non-rectifying) contact with the N-type region 14 which is operated as the base region of the device.

In operation of the device, the P-type region 12 is operated as the emitter electrode of the device and the combination of the $N^+$ zone 16 and P-type region 18 is operated as the collector electrode of the device and comprises a hook-type collector. The emitter region 12 is connected through a signal source 22 and through a bias resistor 24 to a tap 26 on a battery 28 which provides a small positive bias voltage for the emitter. The negative terminal of the battery 28 is connected to the base electrode 20 and to a point of reference potential such as ground. Thus the emitter region 12 is biased in the forward direction with respect to the N-type zone 14. The P-type region 18 of the hook collector is connected through a suitable load device 32 to the positive terminal of the battery 28. The N zone 14 is less highly N-type than the $N^+$ zone 16, and therefore provides a rectifying junction when contacted with the $N^+$ zone. Since the $N^+$ zone 16 of the collector electrode is positive with respect to the N-type zone 14 it is thereby biased in the reverse direction with respect to the zone 14.

Figure 2:
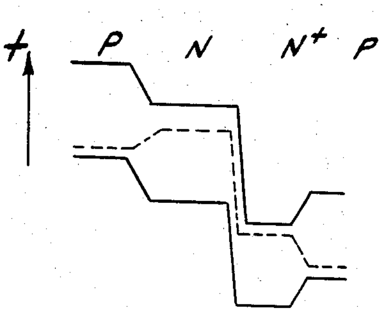
Fig. 2 is a curve showing the internal electrostatic potential distribution within the device 10 with no bias voltages applied thereto.
Figure 3:
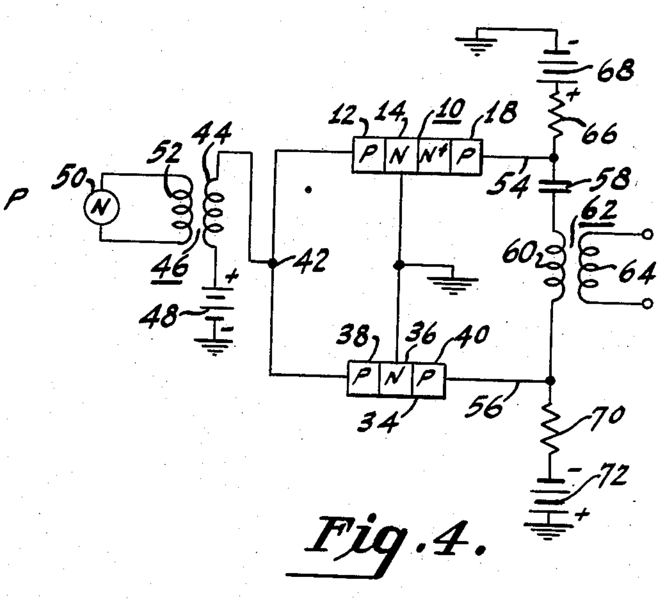
Fig. 3 is a curve showing the internal electrostatic potential distribution within the device 10 with bias voltages applied thereto.

The internal electrostatic potential of the device 10 is shown in Figure 2. The conditions shown therein represent the electrostatic potentials in the various regions of the body with no electrical biases applied thereto. In Figure 3 the electrostatic potentials are shown with the appropriate biases applied.

The forward bias at the emitter 12 causes hole injection across the P–N junction 15 from the P-type emitter into the N-type base region 14. In an electrical body there must be charge neutrality and to achieve charge neutrality as many electrons enter the same N-type base region as holes. These electrons come from the base connection 20. However, because of the electric field existing at the $NN^+$ junction, some of these electrons are lost to the $N^+$ region 16 where they form a negative space charge. While these electrons remain in the $N^+$ region, the hook barrier is reduced and more holes are allowed to flow from the P-type region 18 across the $N^+P$ junction 19 and into the N-type base region 14. Since a hook-type junction has a characteristic current multiplication factor greater than unity, often in the order of hundreds, the device 10 exhibits a high power gain.

In this amplifier, connected with signal input to the emitter as in Figure 1, the output signal in the load 32 is in phase opposition to the input signal. This contrasts to the condition in PNP or NPN triode transistors and the PNPN or NPNP hook transistors which exhibit an output in phase with the input when connected with signal input to the emitter.

Due to the above-described phase reversal characteristic, transistors embodying the principles of the invention may be conveniently employed in circuits of the type shown in U.S. Patents 2,666,818 to Shockley and 2,666,819 to Raisbeck. One typical push-pull type circuit which provides twice the output voltage variation normally characteristic of push-pull amplifiers is shown in Figure 4 and includes the device 10 in combination with an N-type transistor 34. An N-type transistor is a transistor having an N-type base region and rectifying emitter and collector electrodes in contact therewith. The N-type transistor thus includes an N-type semiconductor body 36 having emitter 38 and collector 40 rectifying electrodes which are shown as P-type regions but which might be surface barrier electrodes such as point or line electrodes or surface contact plates or films.

In the circuit, the base regions 14 and 36 of the transistors 10 and 34 are connected to a source of reference potential such as ground. The emitter electrodes 12 and 38 are connected together to a common point 42 which is connected to one end of the secondary winding 44 of an input transformer 46, the other end of said winding being connected to the positive terminal of a battery 48. The negative terminal of the battery 48 is connected to ground. Thus, the emitter electrodes 12 and 38 are biased in the forward direction with respect to the N-type base regions 14 and 36. An input signal source 50 is connected across the primary winding 52 of the transformer 46.

A lead 54 is connected to the collector electrode 18 and a lead 56 is connected to the collector electrode 40. Between the leads 54 and 56 are connected a blocking capacitor 58 and the primary winding 60 of an output transformer 62, the secondary winding 64 of which is coupled to any suitable utilization circuit (not shown).

The lead 54 is also connected through a bias resistor 66 to the positive terminal of a battery 68 the negative terminal of which is grounded and the lead 56 is connected through a bias resistor 70 to the negative terminal of battery 72 the positive terminal of which is grounded. Thus, the collector electrodes 18 and 40 are biased properly in the reverse direction with respect to the base regions 14 and 36, respectively.

With no input signal applied to the circuit of Figure 4, the collector electrodes 18 and 40 are both substantially at the potential of the positive and negative terminals of the batteries 68 and 72, respectively. With the application of an input signal from the source 50 going positive, comparatively large currents flow through each of the resistors 66 and 70 and the collector 18 moves from its positive potential to about zero potential and the collector 40 moves from its negative potential to about zero potential. On the reverse cycle of the input signal, the collectors move from about zero to their positive and negative potentials. Thus, the output signal which appears across the output transformer 62 varies between positive and negative values determined by both batteries 68 and 72 whereas in ordinary push-pull amplifiers the output voltage is swept over the range provided by a single battery.

It is to be understood that in the foregoing circuit of Figure 4, the device 10 may have regions of reversed conductivity type, that is $NPP^+N$ in which case it would be coupled with a P-type transistor. A P-type transistor has a P-type semiconductor body and emitter and collector rectifying electrodes which may be regions of N-type material in rectifying contact therewith.

What is claimed is:

1. Semiconductor apparatus comprising a body of semiconductor material of one type of conductivity, an emitter electrode in rectifying contact with said body and biased in the forward direction with respect thereto, and a hook-type collector electrode in rectifying contact with said body, said collector electrode comprising a first zone of semiconductor material of the same type of conductivity as said body but of greater conductivity and a second zone of different conductivity-type semiconductor material, said first zone being disposed between said body and said second zone, said second zone being biased in the forward direction with respect to first zone, and said first zone being biased in the reverse direction with respect to said body.

2. Semiconductor apparatus comprising a body of semiconductor material of one type of conductivity, an emitter electrode in rectifying contact with said body and biased in the forward direction with respect thereto, a signal source connected to said emitter electrode, and a hook-type collector electrode in rectifying contact with said body, said collector electrode comprising a first zone of semiconductor material of the same type of conductivity as said body but of greater conductivity and a second zone of different conductivity-type semiconductor material, said first zone being disposed between said body and said second zone, said second zone being biased in the forward direction with respect to first zone, said first zone being biased in the reverse direction with respect to said body, and a load circuit connected to said collector electrode.

3. A semiconductor system comprising a first device including a body of semiconductor material of one type of conductivity, an emitter electrode in rectifying contact with said body, a hook-type collector electrode in rectifying contact with said body, said collector electrode comprising a first zone of semiconductor material of the same type of conductivity as said body but of greater conductivity and a second zone of different conductivity-type semiconductor material, said first zone being disposed between said body and said second zone, a second device including a body of semiconductor material of said one type of conductivity and emitter and collector electrodes in rectifying contact therewith, said emitter electrodes being interconnected and having a signal source connected thereto, and said collector electrodes being connected to a load circuit, said body of semiconductor material of said first device and said body of semiconductor material of said second device being electrically connected to a point of reference potential.

4. A semiconductor device comprising a semiconductive body of one conductivity type including a first region and a second region contiguous therewith, said first region having a lower conductivity than said second region, the junction formed by said two regions constituting a rectifying barrier, a first rectifying electrode in contact with said first region and comprising an emitter electrode, and second rectifying electrode in contact with said second region, said second rectifying electrode and said second region comprising a hook-type collector means to bias said first electrode in its forward direction with respect to said body, and means to bias said second electrode in its forward direction with respect to said second region, said second electrode bias means also being effective to bias said rectifying barrier in its reverse direction.

5. A semiconductor system comprising a device including a semiconductive body of one conductivity type including a first region and a second region contiguous therewith, said first region having a lower conductivity than said second region, the junction formed by said two regions constituting a rectifying barrier, a first rectifying electrode in contact with said first region and comprising an emitter electrode, and second rectifying electrode in contact with said second region, said second electrode and said second region comprising a hook-type collector means to bias said first electrode in its forward direction with respect to said body, means to bias said second electrode in its forward direction with respect to said second region, said second electrode bias means also being effective to bias said rectifying barrier in its reverse direction, signal input means connected between said first region and said first electrode, and signal output means connected between said first region and said second electrode.

6. A semiconductor device comprising a body of semiconductive material having therein four zones arranged in succession, adjacent ones of said zones being contiguous, the end zones being of one conductivity type and the central zones being of the opposite conductivity type, one of said central zones having a greater conductivity than the other one, means for impressing a signal between the low conductivity central zone and the end zone contiguous therewith, and means to connect a utilization circuit between said low conductivity central zone and the end zone spaced apart therefrom.

7. A semiconductor system comprising first and second semiconductor devices cooperatively connected to amplify an input signal and to translate said input signal into two output signals having substantially a 180° phase relationship to each other with respect to a single point of reference potential, said first device comprising a body of semiconductive material of one conductivity type, an emitter electrode and a collector electrode each in rectifying contact with said body, said collector electrode comprising a first zone of semiconductive material having a conductivity of the same type as, but greater in value than, the conductivity of said body, and a second zone of semiconductive material of different conductivity type from said body, said first zone being disposed between said body and said second zone; said second device being a transistor having emitter and collector electrodes and a base connection; said system also including means to apply a signal between a point of reference potential and both said emitter electrodes, means to connect said body of said first device and said base connection of said second device to said point of reference potential, and output means to connect a utilization circuit between the collector electrodes of said first and second devices.

References Cited in the file of this patent

UNITED STATES PATENTS

| | | |
|---|---|---|
| 2,603,693 | Kircher | July 15, 1952 |
| 2,603,694 | Kircher | July 15, 1952 |
| 2,623,105 | Shockley et al. | Dec. 23, 1952 |
| 2,655,610 | Ebers | Oct. 13, 1953 |
| 2,666,819 | Raisbeck | Jan. 19, 1954 |
| 2,691,075 | Schwartz | Oct. 5, 1954 |
| 2,735,049 | DeForest | Feb. 14, 1956 |
| 2,763,731 | Pfann | Sept. 8, 1956 |
| 2,767,358 | Early | Oct. 16, 1956 |
| 2,778,885 | Shockley | Jan. 22, 1957 |
| 2,778,956 | Dacey et al. | Jan. 22, 1957 |
| 2,811,653 | Moore | Oct. 29, 1957 |

FOREIGN PATENTS

| | | |
|---|---|---|
| 700,241 | Great Britain | Nov. 25, 1953 |